(12) United States Patent
Song et al.

(10) Patent No.: US 8,599,607 B2
(45) Date of Patent: Dec. 3, 2013

(54) DIODE AND MEMORY DEVICE HAVING A DIODE

(75) Inventors: Wendong Song, Singapore (SG); Luping Shi, Singapore (SG); Yun Fook Thomas Liew, Singapore (SG); Tow Chong Chong, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/324,242

(22) Filed: Dec. 13, 2011

(65) Prior Publication Data

US 2012/0147668 A1   Jun. 14, 2012

(30) Foreign Application Priority Data

Dec. 13, 2010   (SG) .............................. 201009242-7

(51) Int. Cl.
*G11C 17/06* (2006.01)

(52) U.S. Cl.
USPC ......................................... 365/175; 365/163

(58) Field of Classification Search
USPC .................................................. 365/163, 175
See application file for complete search history.

(56) References Cited

U.S. PATENT DOCUMENTS

| | | | | |
|---|---|---|---|---|
| 5,272,370 A | * | 12/1993 | French ........................ | 257/353 |
| 7,659,474 B2 | * | 2/2010 | Joslin et al. .................. | 136/252 |
| 2003/0081527 A1 | * | 5/2003 | Gibson et al. ................ | 369/101 |
| 2009/0168493 A1 | * | 7/2009 | Kim et al. .................... | 365/148 |

* cited by examiner

*Primary Examiner* — Hoai V Ho
(74) *Attorney, Agent, or Firm* — K. David Crockett, Esq.; Niky Economy Syrengelas, Esq.; Crockett & Crockett, PC

(57) ABSTRACT

A diode and a memory device having a diode are provided. The diode includes a semiconductor layer and phase change material layer. The semiconductor layer and the phase change material layer have different energy bandgaps and different carrier concentrations such that an isotype heterojunction is formed at a boundary interface between the semiconductor layer and the phase change material layer.

19 Claims, 7 Drawing Sheets

DIODE AND MEMORY DEVICE HAVING A DIODE

This application claims the benefit of priority of Singapore Patent Application No. 201009242-7, filed 13 Dec. 2010, the contents of which are hereby incorporated by reference in its entirety for all purposes.

TECHNICAL FIELD

Various embodiments relate generally to a diode and a memory device having a diode.

BACKGROUND

A conventional diode includes a p-type phase change material (e.g. germanium-antimony-tellurium (Ge—Sb—Te)) disposed on an n-type semiconductor (e.g. n-silicon). The p-type phase change material contains positive charge carriers (holes) while the n-type semiconductor contains negative charge carriers (electrons). The terminals of the conventional diode are attached to each of the p-type phase change material and the n-type semiconductor. A boundary between the p-type phase change material and the n-type semiconductor is called a p-n junction, where the action of the diode takes place. Current flows in a direction from the p-type side (anode) to the n-type side (cathode). The phase change material acts as a data storage layer which is capable of switching between crystalline and amorphous states. The phase change material in the crystalline and amorphous states has different electrical resistivity. Data can be stored based on the different electrical resistivity of the phase change material in the crystalline and amorphous states.

High reverse breakdown voltage and low leakage current are desired for a diode used in a memory device. However, the conventional phase change p-n junction diode has low reverse breakdown voltage and high leakage current which is detrimental to a read operation of the memory device.

SUMMARY

According to one embodiment, a diode is provided. The diode includes a semiconductor layer and phase change material layer. The semiconductor layer and the phase change material layer have different energy bandgaps and different carrier concentrations such that an isotype heterojunction (P-p heterojunction or N-n heterojunction) is formed at a boundary interface between the semiconductor layer and the phase change material layer.

According to another embodiment, a memory device including a diode as described above is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Embodiments of a diode and a memory device having a diode will be described in detail below with reference to the accompanying figures. It will be appreciated that the embodiments described below can be modified in various aspects without changing the essence of the invention.

Figure 1:
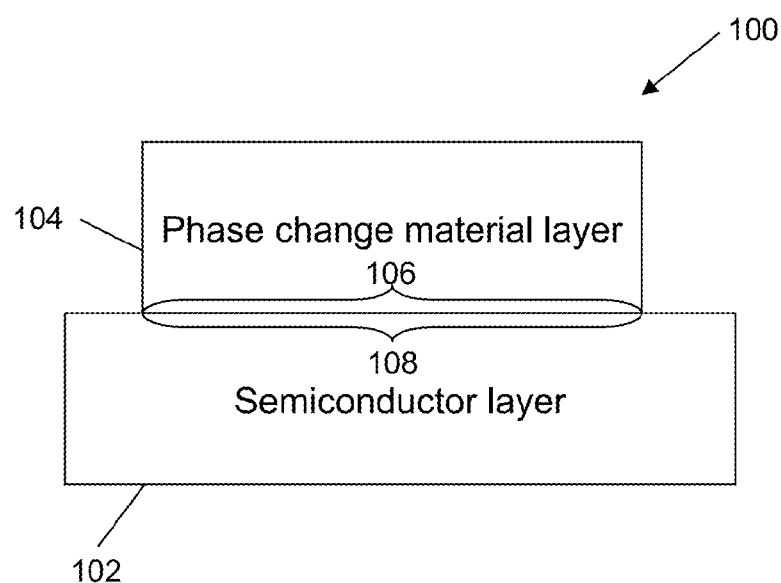
FIG. 1 shows a schematic diagram of a diode according to one embodiment.

FIG. 1 shows a schematic diagram of a diode 100. The diode 100 includes a semiconductor layer 102 and a phase change material layer 104. The phase change material layer 104 may be disposed above the semiconductor layer 102. The semiconductor layer 102 and the phase change material layer 104 have different energy bandgaps and different carrier concentrations such that an isotype heterojunction 106 is formed at a boundary interface 108 between the semiconductor layer 102 and the phase change material layer 104.

In one embodiment, the isotype heterojunction 106 is a P-p heterojunction. The semiconductor layer 102 is a p-type semiconductor material and the phase change material layer 104 is a p-type phase change material.

In another embodiment, the isotype heterojunction 106 is an N-n heterojunction. The semiconductor layer 102 is an n-type semiconductor material and the phase change material layer 104 is an n-type phase change material.

Various materials may be used for the phase change material layer 104. In one embodiment, the phase change material layer 104 may include chalcogenide alloy. The chalcogenide alloy may include elements of group VI of the periodic table. Some examples of the elements of group VI of the periodic table include but are not limited to sulfur (S), selenium (Se) and tellurium (Te). The chalcogenide alloy may be combined with elements of group IV and elements of group V of the periodic table. Therefore, the phase change material layer 104 may include but are not limited to germanium-tellurium (Ge—Te), antimony-tellurium (Sb—Te), tin-tellurium (Sn—Te), antimony-selenium (Sb—Se), indium-selenium (In—Se), germanium-antimony-tellurium (Ge—Sb—Te/GST), platinum-germanium-tellurium (Pt—Ge—Te), indium-antimony-tellurium (In—Sb—Te), arsenic-antimony-tellurium (As—Sb—Te), arsenic-germanium-tellurium (As—Ge—Te), selenium-antimony-tellurium (Se—Sb—Te), tin-tellurium-selenium (Sn—Te—Se), germanium-tellurium-tin (Ge—Te—Sn), antimony-selenium-bismuth (Sb—Se—Bi), gallium-tellurium-selenium (Ga—Te—Se), indium-selenium-titanium (In—Se—Ti), germanium-tellurium-titanium (Ge—Te—Ti), germanium-tellurium-tin-oxygen (Ge—Te—Sn—O), germanium-tellurium-tin-gold (Ge—Te—Sn—Au), germanium-tellurium-tin-palladium (Ge—Te—Sn—Pd), germanium-antimony-tellurium-selenium (Ge—Sb—Te—Se), silver-indium-antimony-tellurium (Ag—In—Sb—Te), germanium-antimony-tellurium-nitrogen (Ge—Sb—Te—N), and germanium-antimony-tellurium-oxygen (Ge—Sb—Te—O). The phase change material layer 104 may include but are not limited to binary alloys such as GaSb, InSb, InSe, $As_2S_3$, $Sb_2Te_3$, $Sb_{70}Te_{30}$, $Sb_2Se_3$, GeTe and GeSb, ternary alloys such as $Ge_2Sb_2Te_5$, InSbTe, $In_3SbTe_2$, GaSeTe, $GeSb_3Te_4$, $GeSb_2Te_4$, $SnSb_2Te_4$, $GeSb_4Te_7$ and $Si_2Sb_2Te_5$, and quaternary alloys such as AgInSbTe, BiGeSbTe, $Ge_{41}Sb_{12}Te_{41}Se_6$, GeSnSbTe, GeSbSeTe, $Ag_5In_5Sb_{60}Te_{30}$, $Te_{81}Ge_{15}Sb_2S_2$ and N-doped $Ge_2Sb_2Te_5$.

In another embodiment, the phase change material layer 104 may include a phase change magnetic material. The phase change magnetic material is a compound consisting of a phase change material component and a ferromagnetic material component. The phase change magnetic material exhibits both magnetic properties and phase change effects. The phase change magnetic material may include iron-germanium-antimony-tellurium (Fe—Ge—Sb—Te/Fe-GST).

Various materials may be used for the semiconductor layer 102. The semiconductor layer 102 may include a semiconductor material. The semiconductor material may include but are not limited to group IV elements, IV-IV compounds, III-V compounds, II-VI compounds, IV-VI compounds and organic semiconductors. Some examples of the group IV elements are carbon, silicon and germanium. An example of the IV-IV compound is silicon carbide (SiC). Some examples of the III-V compounds are aluminum antimonide (AlSb), gallium antimonide (GaSb), gallium nitride (GaN), gallium arsenide (GaAs), gallium phosphide (GaP), indium antimonide (InSb), indium arsenide (InAs) and indium phosphide (InP). Some examples of the II-VI compounds are cadmium sulfide (CdS), cadmium selenide (CaSe), zinc oxide (ZnO) and zinc sulfide (ZnS). Some examples of the IV-VI compounds are lead sulfide (PbS) and lead telluride (PbTe). An example of the organic semiconductor is polyacetylene.

The semiconductor layer 102 and the phase change material layer 104 have different energy bandgaps and different carrier concentrations. In one embodiment, the phase change material layer 104 may have an energy bandgap of less than 5 eV. The phase change material layer 104 may have an energy bandgap of about 0.7 eV. The energy bandgap of the phase change material layer 104 may be vary according to e.g. the materials used for the phase change material layer 104 and the state (e.g. amorphous state or crystalline state) of the phase change material layer 104. For example, the phase change material layer 104 may have an energy bandgap of about 0.7 eV for amorphous $Ge_2Sb_2Te_5$ and an energy bandgap of about 0.5 eV for crystalline $Ge_2Sb_2Te_5$. In one embodiment, the semiconductor layer 102 may have an energy bandgap larger than 0.1 eV. The semiconductor layer 102 may have an energy bandgap of about 1.1 eV. The energy bandgap of the semiconductor layer 102 may vary according to e.g. the materials used for the semiconductor layer 102. For example, the semiconductor layer 102 having silicon may have an energy bandgap of about 1.1 eV. The phase change material layer 104 may have a carrier concentration of about $10^{20}$ $cm^{-3}$ or less. The semiconductor layer 102 may have a carrier concentration of about $10^{16}$ $cm^{-3}$. Alternatively, the semiconductor layer 102 may have a carrier concentration above $10^{10}$ $cm^{-3}$.

Figure 2:
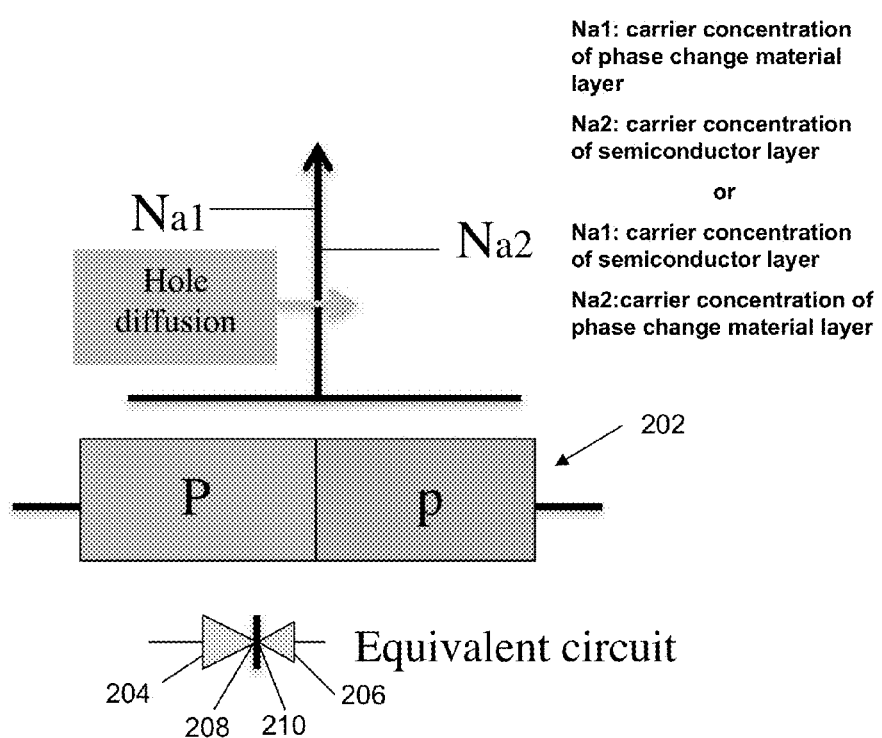
FIG. 2 shows a schematic diagram of a P-p heterojunction of a diode according to one embodiment.

Due to the difference in the energy bandgap and the carrier concentration of the semiconductor layer 102 and the phase change material layer 104, an isotype heterojunction 202 due to hole diffusion may be formed as shown in FIG. 2. FIG. 2 shows a schematic diagram of an exemplary P-p heterojunction 202. The P-p heterojunction 202 can be represented by two Schottky diodes 204, 206 connected in series with respective negative terminals 208, 210 of the two Schottky diodes 204, 206 connected together.

Figure 3:
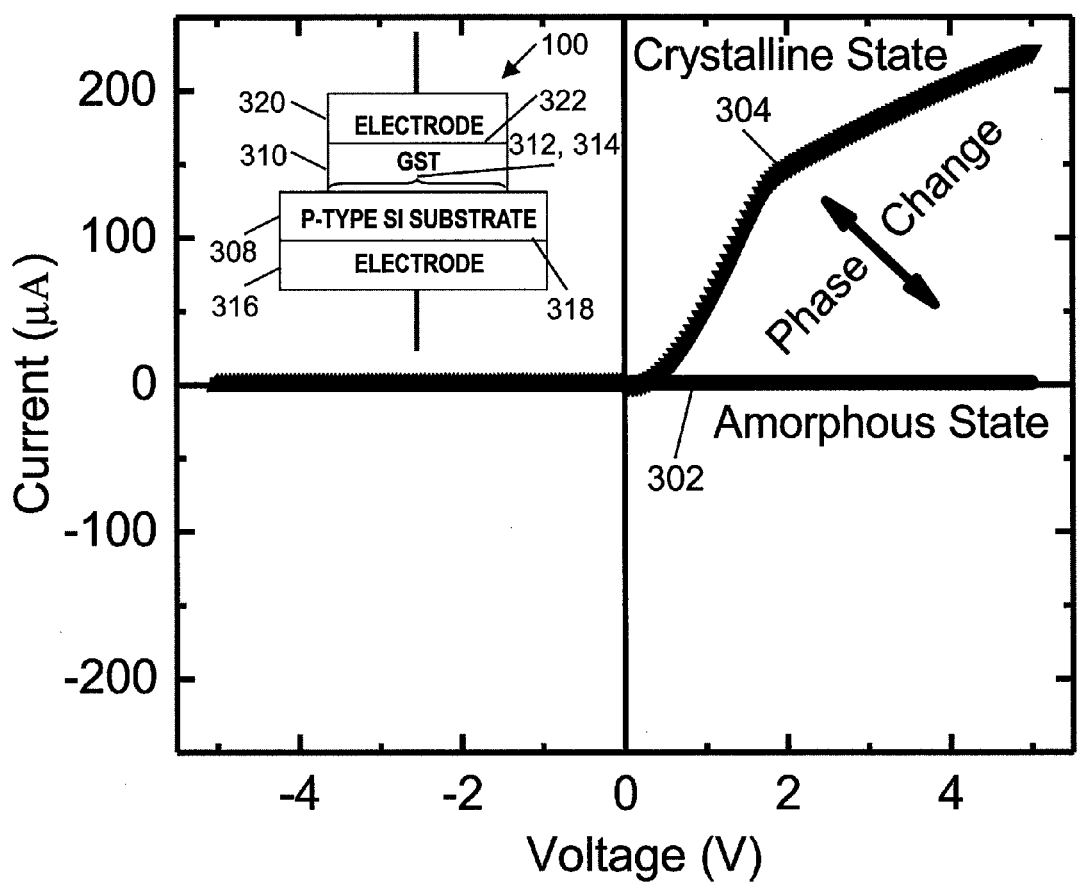
FIG. 3 shows graphs of current plotted against voltage for a diode when a phase change material layer of the diode is at an amorphous state and at a crystalline state respectively according to one embodiment.

FIG. 3 shows a graph 302 of current plotted against voltage for a diode when a phase change material layer of the diode is at an amorphous state. FIG. 3 also shows a graph 304 of current plotted against voltage for the diode when the phase change material layer of the diode is at a crystalline state. In this embodiment, the diode 100 has a p-type semiconductor layer 308 including silicon and a p-type phase change material layer 310 including Ge—Sb—Te. The phase change material layer 310 is disposed above the semiconductor layer 308. A P-p heterojunction 312 is formed at a boundary interface 314 between the semiconductor layer 308 and the phase change material layer 310. The diode 100 also includes a first electrode 316 disposed on one side 318 of the semiconductor layer 308 away from the phase change material layer 310, and a second electrode 320 disposed on one side 322 of the phase change material layer 310 away from the semiconductor layer 308.

It can be observed from FIG. 3 that the I-V curve 304 is large when the phase change material layer 310 is at a crystalline state while the I-V curve 302 is very small when the phase change material layer 310 is at an amorphous state. When the phase change material layer 310 undergoes a phase change between amorphous and crystalline states, the I-V curve changes between curve 302 and curve 304.

From FIG. 3, it can be observed that a leakage current (reverse current) of the diode 100 is very low. In one embodiment, the diode 100 may have a leakage current of about $10^{-6}$ A to about $10^{-10}$ A. In another embodiment, the diode 100 may have a leakage current less than $10^{-6}$ A. It can also be observed from FIG. 3 that the diode 100 has a reverse breakdown voltage larger than 3 V. In one embodiment, the diode 100 may have a reverse breakdown voltage of about 5 V or more.

Figure 4:
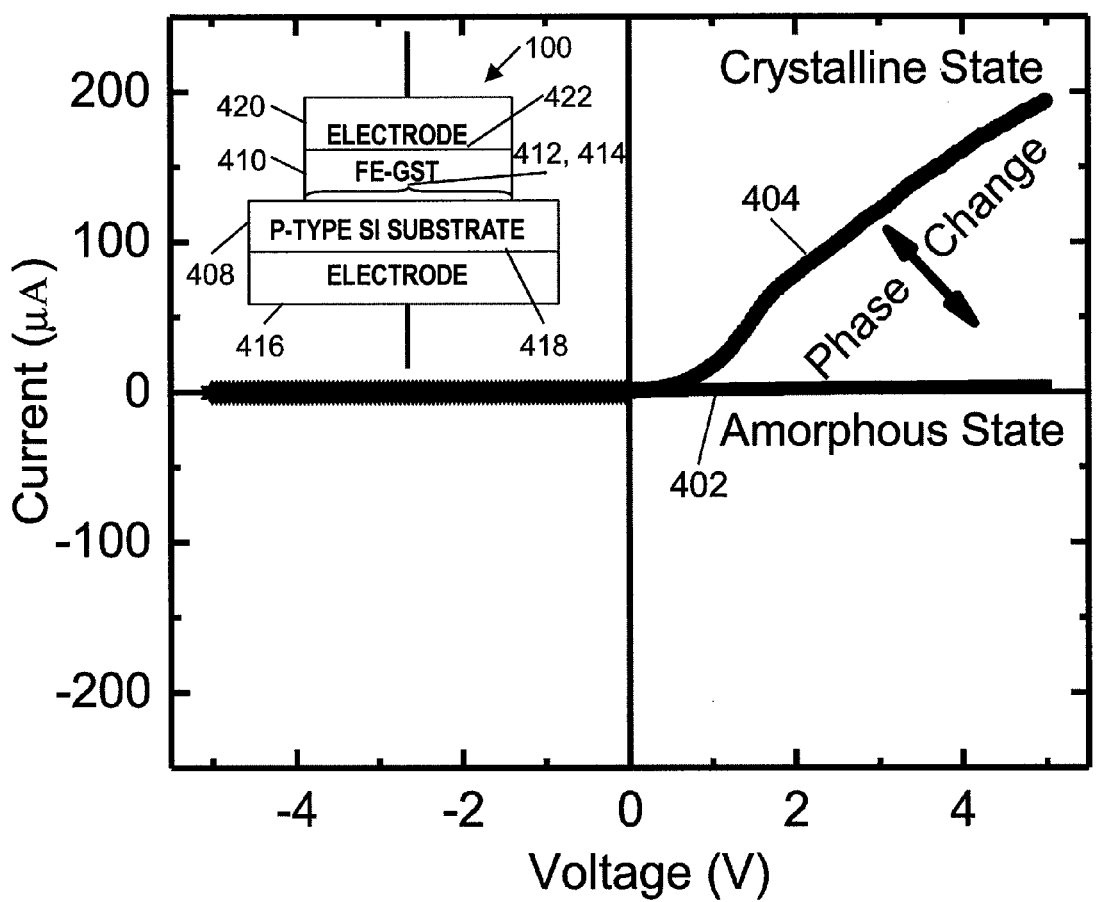
FIG. 4 shows graphs of current plotted against voltage for a diode when a phase change magnetic material layer of the diode is at an amorphous state and at a crystalline state respectively according to one embodiment.

FIG. 4 shows a graph 402 of current plotted against voltage for a diode when a phase change magnetic material layer of the diode is at an amorphous state. FIG. 4 also shows a graph 404 of current plotted against voltage for the diode when a phase change magnetic material layer of the diode is at a crystalline state. In this embodiment, the diode 100 has a p-type semiconductor layer 408 including silicon and a p-type phase change magnetic material layer 410 including Fe—Ge—Sb—Te. The phase change magnetic material layer 410 is disposed above the semiconductor layer 408. A P-p heterojunction 412 is formed at a boundary interface 414 between the semiconductor layer 408 and the phase change magnetic material layer 410. The diode 100 also includes a first electrode 416 disposed on one side 418 of the semiconductor layer 408 away from the phase change magnetic material layer 410, and a second electrode 420 disposed on one side 422 of the phase change magnetic material layer 410 away from the semiconductor layer 408.

It can be observed from FIG. 4 that the I-V curve 404 is large when the phase change magnetic material layer 410 is at a crystalline state while the I-V curve 402 is very small when the phase change magnetic material layer 410 is at an amorphous state. When the phase change magnetic material layer 410 undergoes a phase change between amorphous and crystalline states, the I-V curve changes between curve 402 and curve 404. The experimental results shown in FIG. 4 are similar to those shown in FIG. 3.

Figure 5A:
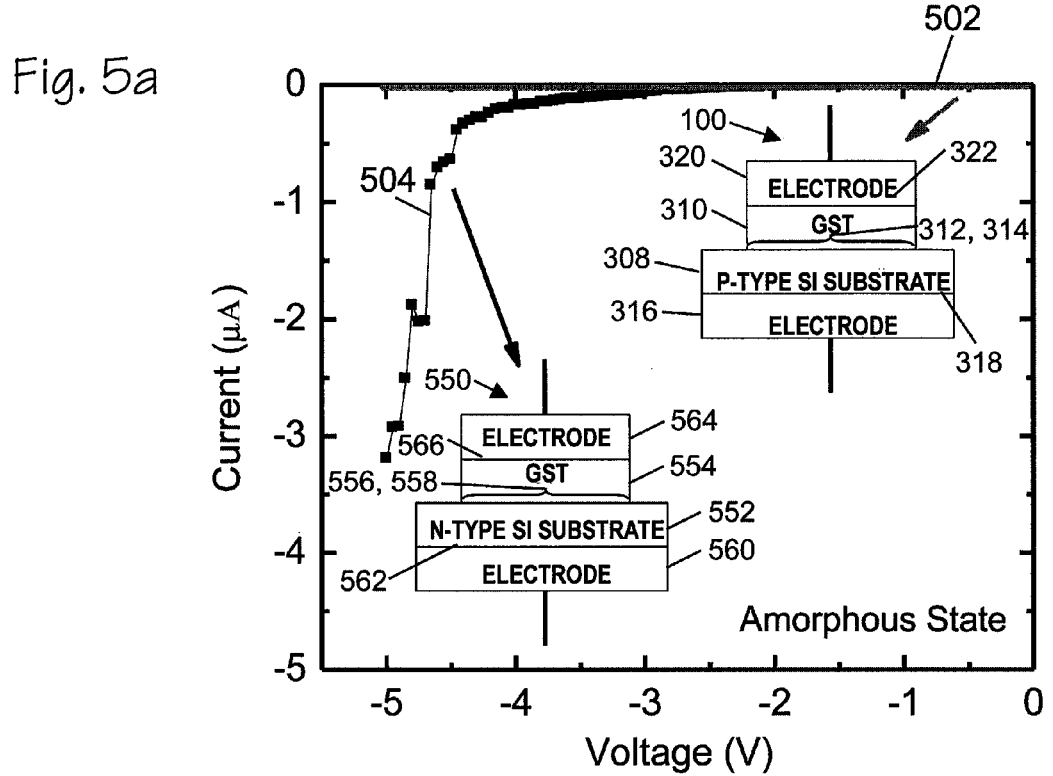
FIG. 5a shows a graph of current plotted against voltage for a diode when a phase change material layer of the diode is at an amorphous state, and a graph of current plotted against voltage for a conventional diode when a phase change material layer of the conventional diode is at an amorphous state.

FIG. 5a shows a graph 502 of current plotted against voltage for a diode when a phase change material layer of the diode is at an amorphous state. FIG. 5a also shows a graph 504 of current plotted against voltage for a conventional diode when a phase change material layer of the conventional diode is at an amorphous state.

Figure 5B:
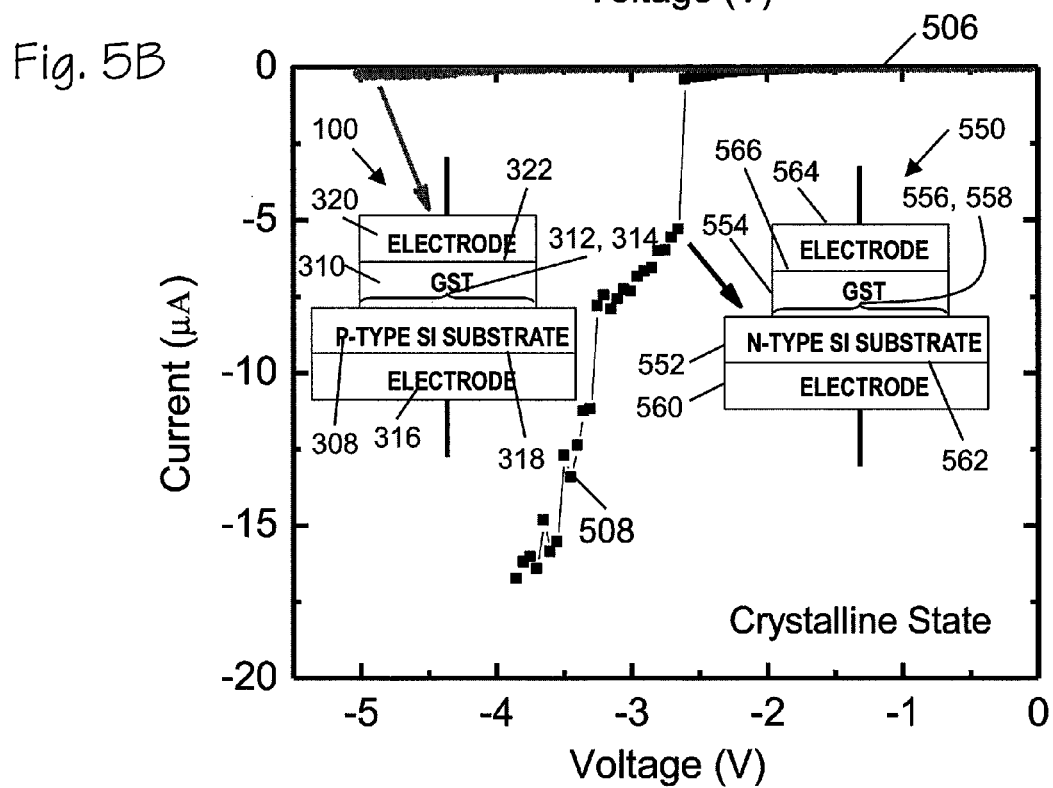
FIG. 5b shows a graph of current plotted against voltage for a diode when the phase change material layer of the diode is at a crystalline state, and a graph of current plotted against voltage for a conventional diode when the phase change material layer of the conventional diode is at a crystalline state.

FIG. 5b shows a graph 506 of current plotted against voltage for the diode when the phase change material layer of the diode is at a crystalline state. FIG. 5b also shows a graph 508 of current plotted against voltage for the conventional diode when the phase change material layer of the conventional diode is at a crystalline state.

In this embodiment, the diode 100 has a same structure as described above with regards to FIG. 3. The conventional diode 550 has an n-type semiconductor layer 552 including silicon and a p-type phase change material layer 554 including Ge—Sb—Te. The phase change material layer 554 is disposed above the semiconductor layer 552. A p-n junction 556 is formed at a boundary interface 558 between the semiconductor layer 552 and the phase change material layer 554. The conventional diode 550 also includes a first electrode 560 disposed on one side 562 of the semiconductor layer 552 away from the phase change material layer 554, and a second electrode 564 disposed on one side 566 of the phase change material layer 554 away from the semiconductor layer 552. All parameters for the diode 100 and the conventional diode 550 may be the same except the diode 100 has a p-type semiconductor layer including silicon while the conventional diode 550 has a n-type semiconductor layer including silicon.

It can be observed from FIGS. 5a and 5b that the leakage current is large for the p-n junction conventional diode 550. When the phase change material layer 554 of the conventional diode 550 undergoes a phase change from an amorphous state to a crystalline state, the leakage current increases very fast for the p-n junction conventional diode 550 at crystalline state as shown in FIG. 5b. However, the leakage current is kept at a small value for the P-p heterojunction diode 100 at both amorphous and crystalline states.

From FIGS. 5a and 5b, it can be observed that the reverse breakdown voltage is about 2.5 V for the conventional diode 550. The reverse breakdown voltage is too low for the conventional diode 550 to be used in a memory device. The reverse breakdown is above 5 V for the diode 100, which is suitable for the diode 100 to be used in a memory device.

For an ideal p-n junction diode, the leakage current is the sum of two parts contributed from minority electron and hole diffusion. However, for a P-p heterojunction diode, the leakage current is proportional to the difference between minority electrons in both parts (e.g. semiconductor layer and phase change material layer) of the P-p heterojunction diode. This can qualitatively explain the low leakage current in the P-p heterojunction diode. Due to Zener effect, the P-p heterojunction diode has a larger breakdown voltage than the p-n junction diode.

The diode 100 has a simple structure, low leakage current, and high reverse breakdown voltage. The diode 100 can be easily reduced to cell size for use in high density memory. The diode 100 can be manufactured at low cost due to its simple structure and can be fabricated at room temperature without annealing.

Figure 6:
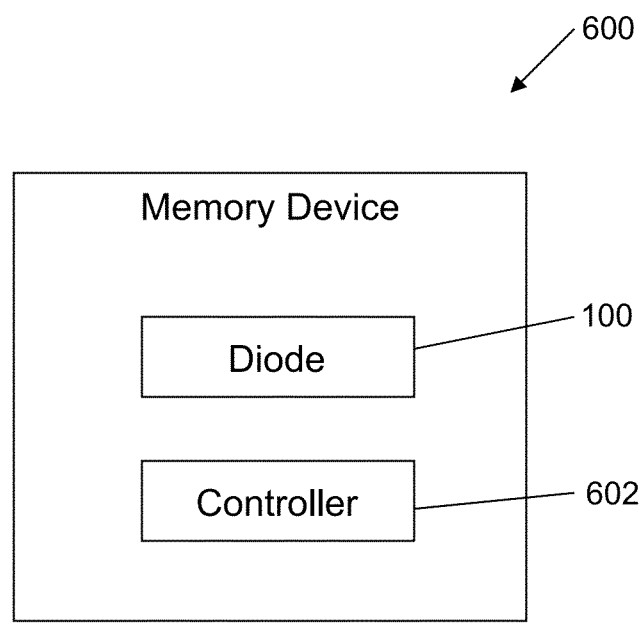
FIG. 6 shows a schematic diagram of a memory device having a diode according to one embodiment.

FIG. 6 shows a schematic diagram of a memory device 600 including a diode 100. The memory device 600 further includes a controller 602. The controller 602 is configured to provide a plurality of operation cycles for the diode 100. Each operation cycle includes a set mode and a reset mode. The controller 602 may be configured to provide a bias voltage to the diode 100. The bias voltage may range from about 0 V to about 5 V. The controller 602 may be configured to provide a current or a voltage to the diode 100. The current or voltage provided to the diode 100 may be single pulse or plural pulse. The current or voltage may have a pulse width of about 1 ms or smaller. The current may include both read and write currents. The write current may include reset or set current. The voltage may include both read and write voltages. The write voltage may include reset or set voltage.

The diode 100 has a high resistance state and a low resistance state. The diode 100 is configured to store data by changing between the high resistance state and the low resistance state during each operation cycle of the memory device 600. In the reset mode of the memory device 600, the controller 602 is configured to pass a current equal to a reset current of the memory device 600 through the isotype heterojunction 106 of the diode 100 to change the diode 100 from the low resistance state to the high resistance state. One way of changing the diode 100 from the low resistance state to the high resistance state is to change the phase change material layer 104 from a crystalline state to an amorphous state. In the set mode of the memory device 600, the controller 602 is configured to pass a current equal to a set current of the memory device 600 through the heterojunction 106 of the diode 100 to change the diode 100 from the high resistance state to the low resistance state. One way of changing the diode 100 from the high resistance state to the low resistance state is to change the phase change material layer 104 from the amorphous state to the crystalline state. Therefore, the diode 100 is at the high resistance state when the phase change material layer 104 is at the amorphous state, and the diode 100 is at the low resistance state when the phase change material layer 104 is at the crystalline state.

The controller 602 is configured such that each operation cycle further includes a read mode. In the read mode of the memory device 600, the controller 602 is configured to apply a read current or a read voltage of the memory device 600 at the heterojunction 106 of the diode 100. In the read mode of the memory device 600, an electrical parameter measured at the low resistance state of the diode 100 is read as a first data value. In one embodiment, the first data value is 0. In the read mode of the memory device 600, an electrical parameter measured at the high resistance state of the diode 100 is read as a second data value different from the first data value. In one embodiment, the second data value is 1. The electrical parameter may be voltage, current or resistance.

Figure 7:
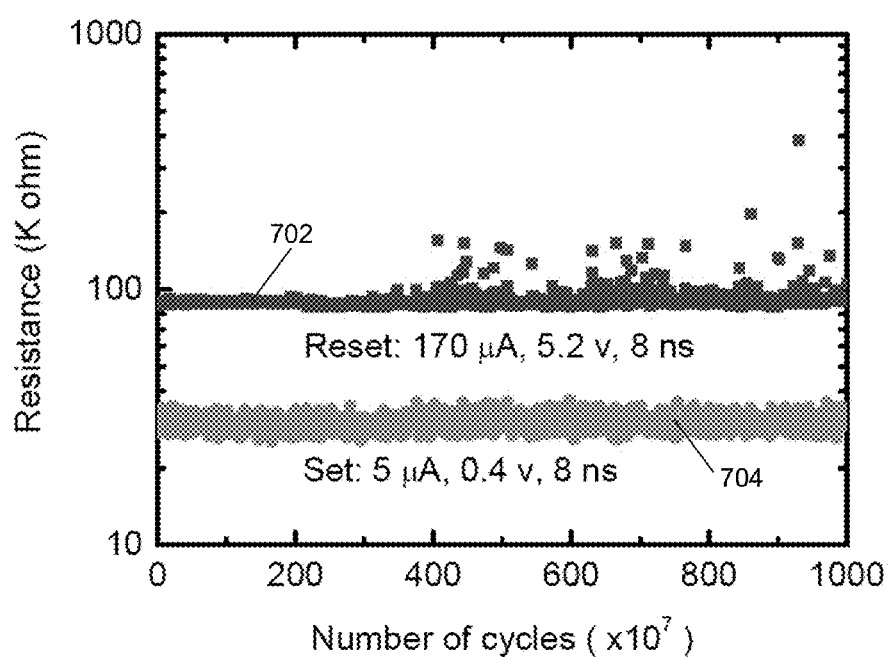
FIG. 7 shows graphs of resistance plotted against number of cycles representing reset mode and set mode of a memory device respectively according to one embodiment.

FIG. 7 shows a graph 702 of resistance plotted against number of cycles representing reset mode of a memory device. FIG. 7 shows a graph 704 of resistance plotted against number of cycles representing set mode of the memory device. In this embodiment, the memory device 600 has a diode 100 having a P-p heterojunction 106. One SET and one RERET operation are defined as one cycle. In an endurance test, cycles of SET/RESET pulses can be applied to the memory device 600 at room temperature ambient.

The reset mode of the memory device 600 may have a current (RESET current) of about 170 µA, a voltage of about 5.2 V and a duration/pulse width of about 8 ns every operation cycle. The set mode of the memory device 600 may have a current (SET current) of about 5 µA, a voltage of about 0.4 V and a duration/pulse width of about 8 ns every operation cycle.

When a pulse current equals to a RESET current of the memory device 600 passing through the isotype heterojunction 106 of the diode 100, the RESET current induces the diode 100 to a high resistance state (e.g. represented by graph 702). When a pulse current equals to a SET current of the memory device passing through the isotype heterojunction 106 of the diode 100, the SET current induces the diode 100 to a low resistance state (e.g. represented by graph 704).

In one embodiment, the controller 602 of the memory device 600 may provide at least $10^4$ operation cycles.

From FIG. 7, it can be observed that the memory device 600 can operate for at least $10^{10}$ cycles. In other words, the controller 602 of the memory device 600 may provide at least $10^{10}$ operation cycles. Up to $10^{10}$ cycle endurance is demonstrated. In other words, the endurance test can be run continuously to $10^{10}$ cycles without memory device failure. Therefore, the memory device 600 having the diode 100 exhibits a good performance.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A diode, comprising:
   a semiconductor layer;
   a phase change material layer;
   wherein the semiconductor layer and the phase change material layer have different energy bandgaps and different carrier concentrations such that an isotype heterojunction is formed at a boundary interface between the semiconductor layer and the phase change material layer;
   wherein the phase change material layer comprises a phase change magnetic material that includes a phase change material component and a ferromagnetic material component.

2. The diode of claim 1, wherein the isotype heterojunction is a P-p heterojunction.

3. The diode of claim 2, wherein the semiconductor layer is a p-type semiconductor material and the phase change material layer comprises a p-type phase change material.

4. The diode of claim 1, wherein the isotype heterojunction is a N-n heterojunction.

5. The diode of claim 4, wherein the semiconductor layer is a n-type semiconductor material and the phase change material layer comprises a n-type phase change material.

6. The diode of claim 1, wherein the diode has a leakage current less than $10^{-6}$ A.

7. A memory device, comprising:
   a diode, comprising:
   a semiconductor layer;
   a phase change material layer;
   wherein the semiconductor layer and the phase change material layer have different energy bandgaps and different carrier concentrations such that an isotype heterojunction is formed at a boundary interface between the semiconductor layer and the phase change material layer;
   wherein the phase change material layer comprises a phase change magnetic material that includes a phase change material component and a ferromagnetic material component.

8. The memory device of claim 7, further comprising:
   a controller configured to provide a plurality of operation cycles for the diode, wherein each operation cycle comprises a set mode and a reset mode.

9. The memory device of claim 7, wherein the diode comprises a high resistance state and a low resistance state, and is configured to store data by changing between the high resistance state and the low resistance state during each operation cycle of the memory device.

10. The memory device of claim 9, wherein the diode changes from the low resistance state to the high resistance state when the phase change material layer changes from a crystalline state to an amorphous state, and wherein the diode changes from the high resistance state to the low resistance state when the phase change material layer changes from the amorphous state to the crystalline state.

11. The memory device of claim 10, wherein the diode is at the high resistance state when the phase change material layer is at the amorphous state and is at the low resistance state when the phase change material layer is at the crystalline state.

12. The memory device of claim 9, wherein in the reset mode of the memory device, the controller is configured to pass a current equal to a reset current of the memory device through the isotype heterojunction of the diode to change the diode from the low resistance state to the high resistance state.

13. The memory device of claim 9, wherein in the set mode of the memory device, the controller is configured to pass a current equal to a set current of the memory device through the isotype heterojunction of the diode to change the diode from the high resistance state to the low resistance state.

14. The memory device of claim 8, wherein the controller is configured such that each operation cycle further comprises a read mode, and wherein in the read mode of the memory device, the controller is configured to apply a read current or a read voltage of the memory device at the isotype heterojunction.

15. The memory device of claim 14, wherein in the read mode of the memory device, an electrical parameter measured at the low resistance state of the diode is read as a first data value.

16. The memory device of claim 15, wherein in the read mode of the memory device, an electrical parameter measured at the high resistance state of the diode is read as a second data value different from the first data value.

17. The memory device of claim 15, wherein the electrical parameter comprises any one of voltage, current and resistance.

18. The memory device of claim 8, wherein the controller is configured such that the plurality of operation cycles comprises at least $10^4$ cycles.

19. The memory device of claim 8, wherein the controller is configured such that the plurality of operation cycles comprises at least $10^{10}$ cycles.

* * * * *